(12) United States Patent  (10) Patent No.: US 8,129,203 B2
Chang et al.  (45) Date of Patent: Mar. 6, 2012

(54) AUTO FEEDBACK APPARATUS FOR LASER MARKING

(75) Inventors: Lan Fang Chang, Yunlin County (TW); Wei-Ming You, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 75 days.

(21) Appl. No.: 12/636,539

(22) Filed: Dec. 11, 2009

(65) Prior Publication Data

US 2010/0240155 A1 Sep. 23, 2010

Related U.S. Application Data

(60) Provisional application No. 61/161,330, filed on Mar. 18, 2009.

(51) Int. Cl.
*H01L 21/66* (2006.01)

(52) U.S. Cl. ............. 438/16; 257/E26.14; 257/E21.521; 257/E21.529

(58) Field of Classification Search .................... 438/16; 257/E26.14, E21.521, E21.529
See application file for complete search history.

(56) References Cited

U.S. PATENT DOCUMENTS

| | | | |
|---|---|---|---|
| 2005/0189329 A1* | 9/2005 | Talwar et al. | 219/121.65 |
| 2006/0131696 A1* | 6/2006 | Arikado et al. | 257/618 |
| 2008/0316504 A1* | 12/2008 | Nemets et al. | 356/614 |

* cited by examiner

*Primary Examiner* — Tony Tran

(74) *Attorney, Agent, or Firm* — Slater & Matsil, L.L.P.

(57) ABSTRACT

A method of manufacturing integrated circuits includes measuring a reflectivity value of a wafer. An optimum energy level for laser marking the wafer is determined using the reflectivity value. A laser beam having the optimum energy level is then emitted to make laser marks on the wafer.

7 Claims, 3 Drawing Sheets

AUTO FEEDBACK APPARATUS FOR LASER MARKING

TECHNICAL FIELD

This application claims the benefit of U.S. Provisional Application No. 61/161,330, entitled "Auto Feedback Apparatus for Laser Marking," filed on Mar. 18, 2009, which is incorporated herein by reference.

This invention relates generally to integrated circuit manufacturing processes and more particularly to processes and apparatuses for making identification numbers on wafers.

BACKGROUND

Integrated circuits are manufactured in the form of wafers, each including a plurality of identical chips. After the integrated circuits are formed, the chips are separated, for example, through die-sawing and are packaged. In order to identify wafers, wafer identification (ID) numbers need to be marked on the wafers.

The wafer ID marking can be divided into two categories. Conventionally, wafer IDs are marked on wafers before metal layers are formed. Typically, an oxide layer is formed on a bare wafer and wafer IDs are marked on the oxide layer by using laser to melt the portion of the oxide layer where wafer IDs are to be shown. This type of marking is referred to as front-end-of-line (FEOL) marking. With more and more metal layers and corresponding dielectric layers formed on wafers, however, the wafer marking is now made to surface dielectric layers overlying the metal layers. This type of marking is referred to as back-end-of-line (BEOL) marking.

It has been noted, however, that in BEOL marking, some wafers suffer from unclear wafer IDs. It has also been noted that whether the wafer IDs are clear or not is related to the conditions of the surface layers on which wafer IDs are to be marked. For example, when making laser marks on a combined dielectric layer, including an undoped silicate glass (USG) layer (with a thickness of 12 kÅ), and a silicon nitride (SiN) layer (with a thickness of 7 kÅ), the wafer IDs were not clear. However, when making wafer IDs on an USG layer with a thickness of 6 kÅ, and a SiN layer with a thickness of 4 kÅ, the wafer IDs were clear.

Conventionally, the wafers with unclear wafer IDs need to be marked again manually. However, mis-operation may occur, resulting in the damage of wafers. In addition, the manual wafer ID marking results in the increase of cycle time for delivering end products to clients. New methods for solving the above-discussed problems are thus needed.

SUMMARY OF THE INVENTION

In accordance with one aspect of the present invention, a method of manufacturing integrated circuits includes measuring a laser reflectivity value of a wafer. An optimum energy level for laser marking the wafer is determined using the laser reflectivity value. A laser beam having the energy level is then emitted to make laser marks on the wafer.

In accordance with another aspect of the present invention, a method of manufacturing integrated circuits includes measuring surface reflectivity values of a plurality of sample wafers; and establishing a correlation between required energy levels for making clear marks on the plurality of sample wafers and the surface reflectivity values of the plurality of sample wafers.

In accordance with yet another aspect of the present invention, a method of manufacturing integrated circuits includes providing a plurality of sample wafers having different surface reflectivity values; and measuring the surface reflectivity values of the plurality of sample wafers. The minimum required energy levels for making clear marks on the plurality of sample wafers are found, and a correlation between required energy levels and the surface reflectivity values of the plurality of sample wafers is established. A laser reflectivity value of a wafer is measured, and an energy level corresponding to the laser reflectivity value is found from the correlation. A laser beam having the energy level is emitted on the wafer to make laser marks.

In accordance with yet another aspect of the present invention, an apparatus for making laser marks on a wafer includes a laser beam emitting apparatus; a light beam emitting device, wherein the light beam has a substantially same wavelength as the laser beam; and a reflectivity measurement device for determining a reflectivity value of the light beam from the wafer.

In accordance with yet another aspect of the present invention, an apparatus for making laser marks on a wafer includes a laser beam emitting apparatus, and a light beam emitting device for emitting a light beam onto the wafer. A reflectivity measurement device is configured to receive a reflected light from the wafer and calculate a reflectivity value. The apparatus further includes a processing unit for controlling the reflectivity measurement device and an energy-adjusting unit. The energy-adjusting unit is configured to receive the reflectivity value from the reflectivity measurement device; determine an energy level of a laser beam based on the reflectivity value and a pre-determined correlation between reflectivity values of wafers and required energy levels for making clear marks on the wafers; and control the laser beam emitting apparatus to emit a laser beam having the required energy level.

The advantageous features of the present invention include reduced cycle time for delivering products to clients and reduced laser particle sputtering due to optimized laser energy. In addition, with no manual laser marking needed to repair unclear wafer IDs, no mis-operations occur.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

When marking identification (ID) numbers of wafers by using laser beams, it has been found that the clarity of the wafer IDs is related to the compositions of the surface dielectric layers of the wafers, on which the laser beams are projected to mark wafer IDs. Table 1 illustrates experiment results indicating the relationship between the clarity of the wafer IDs and the energy levels of the laser beams.

TABLE 1

|  | First Group | Second Group |
|---|---|---|
| 600 µJoules | Clear | Unclear |
| 700 µJoules |  | Unclear |
| 800 µJoules |  | Unclear |
| 900 µJoules |  | Unclear |
| 1000 µJoules |  | Unclear |
| 1100 µJoules |  | Unclear |
| 1200 µJoules |  | Unclear |
| 1300 µJoules |  | Clear |

In the experiments, two groups of sample wafers were used. Each of the first group of sample wafers includes an undoped silicate glass (USG) layer having a thickness of 6 kÅ and a silicon nitride (SiN) layer having a thickness of 4 kÅ on the USG layer. Each of the second group of sample wafers includes a USG layer having a thickness of 12 kÅ and a SiN layer having a thickness of 7 kÅ. The experiment results revealed that when 600 µJoule laser energy or higher is used, wafer IDs can be clearly made on the first group of sample wafers. As a comparison, when the same layer energy levels are used, the wafer IDs made on the second group of wafers may not be clear unless higher energy levels are used. Further study has revealed that the unclear wafer IDs are due to the energies of the laser beams not being high enough to melt the portions of the surface dielectric layers wherein the laser beams are projected.

When laser energy levels are increased (the Second Group column of Table 1), it has been found that the wafer IDs still may not be clear, until the laser energy reaches 1300 µJoules, with which energy level, the wafer IDs are clear enough. Although Table 1 reveals that higher energy levels are beneficial for making clear marks, high laser energy levels may cause sputtering of the surface dielectric material, resulting in particles to be scattered to other parts of the respective wafers. Therefore, the optimum laser energy level that is high enough for making clear laser marks, but not to incur particle scattering needs to be found.

Figure 1:
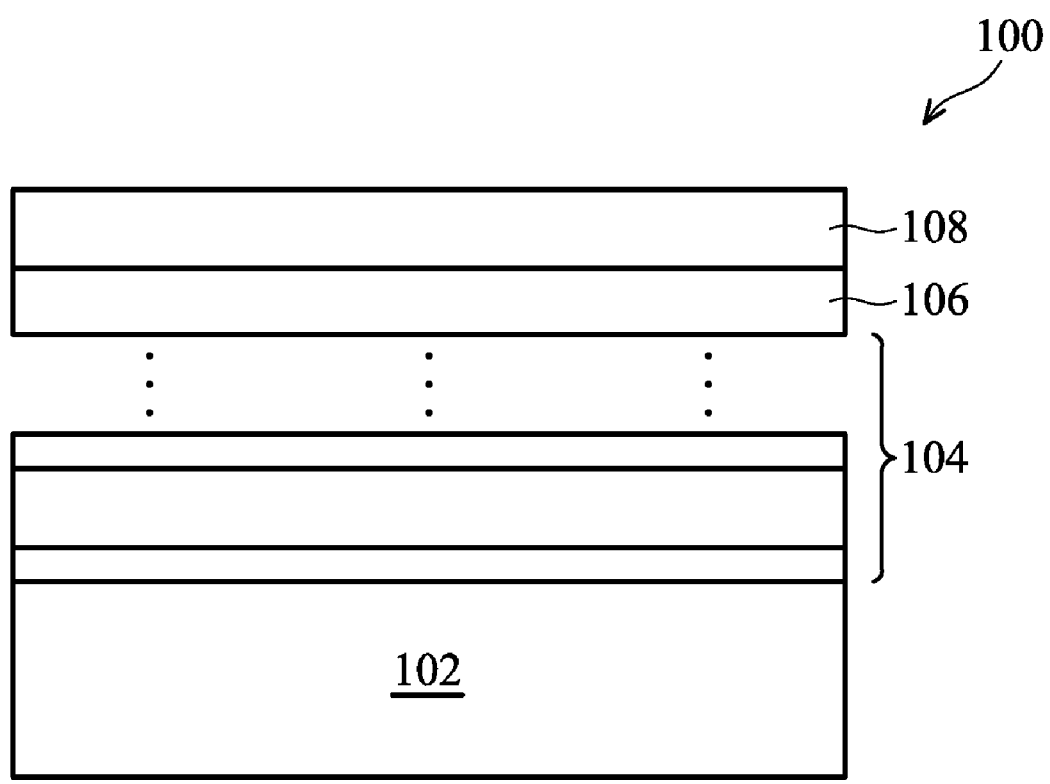
FIG. 1 illustrates a cross-sectional view of a wafer on which a wafer identification (ID) number is to be marked.

FIG. 1 illustrates a cross-sectional view of wafer 100, on which wafer IDs are to be made. Wafer 100 comprises semiconductor substrate 102. Integrated circuits (not shown) such as complementary metal-oxide-semiconductor (CMOS) devices may be formed at the surface of semiconductor substrate 102. Metal layers 104, which include dielectric layers, and metal lines and vias in the dielectric layers, are formed over semiconductor substrate 102. FIG. 1 illustrates two dielectric layers (referred to surface dielectric layers hereinafter) 106 and 108. In an exemplary embodiment, layer 106 is an USG layer, and layer 108 is a SiN layer. The laser is projected onto layer 108 to melt the portion of layer 108, and possibly layer 106, so that wafer IDs may be marked. It is realized, however, that depending on the products and customer requirements, there are many possible combinations of materials and thicknesses of surface dielectric layers. For example, the surface dielectric layers may include one to three layers of passivation layers, which may include different combinations of silicon oxide, silicon nitride, and the like. The surface dielectric layers may also include zero to two USG layers under the passivation layer(s). These layers may also have different thicknesses. Therefore, the surface dielectric layers, on which wafer IDs are to be made, may vary from wafer to wafer significantly, and hence the required energy levels for marking clear wafer IDs may vary from wafer to wafer. Based on the findings discussed in the preceding paragraphs, a novel method for marking wafer IDs on wafers is provided. The variations and the operation of the embodiments are discussed.

Figure 2:
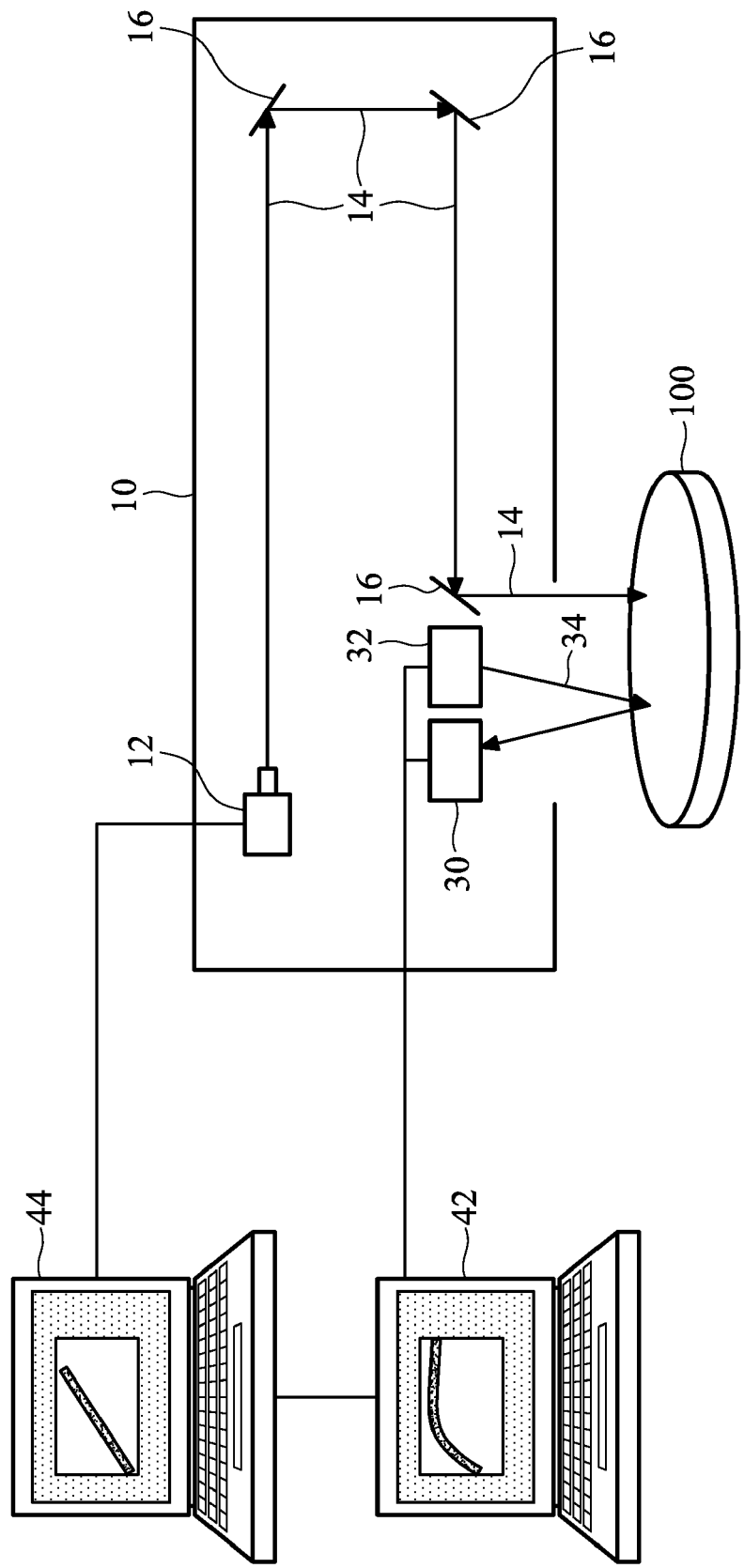
FIG. 2 illustrates an apparatus for marking IDs on wafers.

FIG. 2 illustrates (laser beam generating) apparatus 10 for marking wafer IDs. Apparatus 10 includes laser source 12 (for example, a laser diode) for generating laser beam 14. Inside apparatus 10, laser beam 14 is maneuvered through a path that may include, for example, reflectors 16 for directing laser beam 14. Laser beam 14 is emitted out of apparatus 10 and projected onto wafer 100 to mark wafer IDs. Apparatus 10 is capable of marking patterns of numbers, letters, and other characters onto wafer 100.

In an embodiment, before laser beam 14 is generated and projected onto wafer 100, reflectivity-measuring device 30 is used to measure a reflectivity value of wafer 100 to laser beam 14. The measuring of the reflectivity value of wafer 100 includes projecting a light beam onto wafer 100 and measuring the intensity of the light reflected from wafer 100. In the case the light beam has a same wavelength as laser beam 14; the reflectivity value of wafer 100 to the light beam will be the same as the reflectivity value of wafer 100 to laser beam 14. In an embodiment, light-emitting device 32 emits light beam 34 that has a same wavelength as laser beam 14. In alternative embodiments, light beam 34 has a substantially same wavelength, for example, with less than about five percent difference than the wavelength of laser beam 14. Light beam 34 may have a wavelength of about 1,064 nm. Light beam 34 carries significantly smaller energy levels than laser beam 14, and hence will not make any mark on wafer 100. Light beam 34 may be projected onto random locations of the surface dielectric layers of wafer 100, or onto the same location where a wafer ID is to be made. Wafer 100 partially reflects light beam 34. Reflectivity-measuring device 30 receives the reflected light, measuring the light intensity, and calculates the (light) reflectivity of light beam 34 from wafer 100. The reflectivity value may be calculated as a percentage, with zero percent indicating no light being reflected, and 100 percent indicating 100 percent reflection. Exemplary reflectivity-measuring device 30 is a reflection factor meter, which is manufactured by USHIO (provided by Lighting Edge Technologies, Inc.). When the light beam used to measure the reflectivity value of wafer 100 has the same wavelength as the laser beam for marking the wafer IDs, the reflectivity value of light beam 34 is the same as the reflectivity value of laser beam 14.

Figure 3:
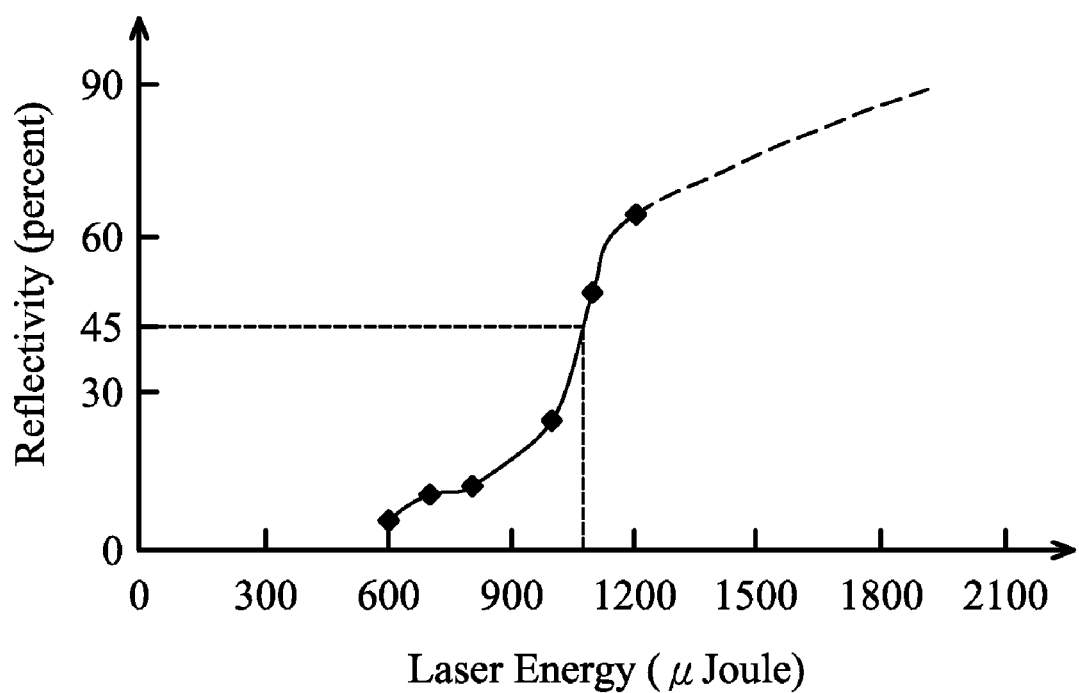
FIG. 3 illustrates reflectivity values of wafers as a function of required laser energy levels for marking clear wafer IDs on the wafers.

After the reflectivity value of wafer 100 is measured and known, the required energy level of laser beam 14 then needs to be determined. It is understood that when a light beam is reflected, less energy of the light beam is absorbed by wafer 100. Accordingly, there is a correlation between the reflectivity value and the energy level of laser beam 14. FIG. 3 illustrates a graph for determining the required energy level of laser beam 14, which graph illustrates experiment results showing an exemplary correlation between the reflectivity values and the required laser energy levels. To obtain the results as shown in FIG. 3, a plurality of sample wafers are measured, wherein the sample wafers include commonly adopted combinations of surface dielectric layers (including different combinations of materials and thicknesses) on which wafer IDs are to be made. The Y-axis indicates the reflectivity values of the sample wafers, while the X-axis indicates the required (minimum) laser energy levels needed to mark clear wafer IDs on the sample wafers. Each sample wafer is applied with laser beams ranging from low energy levels to high energy levels, until a minimum energy level that may result in a clear wafer ID is found. It is noted that with the increase in the reflectivity value, the required energy levels also increase. The correlation may be stored in a database for later access. It is understood that the correlation shown in FIG. 3 is related to a specific wavelength of laser beams. If the wavelength is changed, the corresponding correlation may be different and may be determined again using the above-described method.

Referring back to FIG. 2, the measurement of the reflectivity value of light beam 34 from wafer 100 may be controlled by processing unit 42, which may be a computer. The reflectivity value is then fed to energy-adjusting unit 44, which may store (or have access to) the correlation of the energy levels and the reflectivity values. Energy-adjusting unit 44 may use the pre-determined correlation as shown in FIG. 3 combined with the measured reflectivity value of wafer 100 to find the corresponding laser energy level. For example, referring to FIG. 3, if the measured reflectivity value of wafer 100 is 45%, then the corresponding required laser energy level is about 1060 µJoules. In an embodiment, processing unit 42 and energy-adjusting unit 44 are separate units, for example, each including a computer. In alternative embodiments, processing unit 42 and energy-adjusting unit 44 may be an integrated unit. Energy-adjusting unit 44 then controls apparatus 10 to produce laser beam 14, having the required energy level. Accordingly, the wafer ID made by laser beam 14 will be clear.

In an embodiment, the reflectivity value of a very first wafer of a wafer lot (for example, including 25 wafers) is measured. Since all wafers in the same wafer lot have the same structure, the reflectivity values of all wafers in the same wafer lot will be the same. Accordingly, only the reflectivity value of the first wafer of the wafer lot needs to be measured, while wafer IDs of other wafers in the same wafer lot may be made using the same energy level as for the first wafer. In alternative embodiments, for marking wafer IDs, the reflectivity value of every wafer is measured, so that the correct energy levels of laser beams can be determined.

Although in the preceding paragraphs, wafer IDs are used as examples, it is appreciated that the embodiments of the present invention apply to the laser marking on other components, including, but not limited to, semiconductor materials, metals, dielectric materials, combinations thereof, and multi-layers thereof.

By determining the reflectivity values of wafers, which can be quickly measured, the complex surface conditions (including the materials, the number of surface dielectric layers, and the thicknesses of the surface dielectric layers) are simplified before wafer IDs are made. Accordingly, the laser beams may have optimized energy levels that are high enough for making clear marks, but not excessive to cause particles to be sputtered. The likelihood of marking unclear wafer IDs is essentially eliminated, and hence the likelihood of mis-operation that may be caused by manually marking wafer IDs is also essentially eliminated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of manufacturing integrated circuits, the method comprising:
   providing a wafer;
   establishing a correlation between a plurality of reflectivity values of a plurality of wafers and a plurality of required energy levels for making clear marks on the plurality of wafers;
   measuring a reflectivity value of the wafer;
   determining an energy level for laser marking the wafer using the reflectivity value, wherein the step of determining the energy level comprises finding a corresponding one of the plurality of energy levels in the correlation using the reflectivity value determined in the step of measuring the reflectivity value of the wafer; and
   emitting a laser beam having the energy level to make laser marks on the wafer;
   wherein the step of establishing the correlation comprises:
   providing a plurality of sample wafers having different surface dielectric layers;
   determining the plurality of reflectivity values of the plurality of sample wafers; and
   laser marking each of the plurality of sample wafers to find a minimum required energy level for making a clear mark on each of the plurality of sample wafers.

2. The method of claim 1, wherein the step of measuring the reflectivity value of the wafer comprises:
   emitting a light beam onto the wafer, wherein the light beam has a substantially same wavelength as the laser beam; and
   measuring the reflectivity value by measuring a reflection of the light beam from the wafer.

3. The method of claim 1, wherein the wafer is a first one of a wafer lot comprising a plurality of wafers having identical structures, wherein additional laser marks are made on remaining ones of the plurality of wafers using the laser beam having the energy level, and wherein reflectivity values of the remaining ones of the plurality of wafers are not measured.

4. The method of claim 1, wherein the wafer is a first one of a plurality of wafers, wherein the method further comprises, for each remaining one of the plurality of wafers:
   measuring an additional reflectivity value of each remaining one of the plurality of wafers;
   determining an additional energy level for making a clear laser mark on each remaining one of the plurality of wafers using the additional reflectivity value; and
   emitting an additional laser beam having the additional energy level to make additional laser marks on each remaining one of the plurality of wafers.

5. A method of manufacturing integrated circuits, the method comprising:
   providing a wafer;
   providing a plurality of sample wafers having different surface reflectivity values;
   measuring the surface reflectivity values of the plurality of sample wafers;

finding minimum required energy levels for making clear marks on the plurality of sample wafers;
establishing a correlation between the minimum required energy levels and the surface reflectivity values of the plurality of sample wafers;
determining a reflectivity value of the wafer;
determining an energy level corresponding to the reflectivity value of the wafer using the correlation; and
emitting a laser beam having the energy level onto the wafer to make laser marks on the wafer.

6. The method of claim 5, wherein the step of determining the reflectivity value of the wafer comprises:

emitting a light beam onto the wafer, wherein the light beam has a lower energy than the laser beam, and wherein the light beam has substantially a same wavelength as the laser beam; and
determining the reflectivity value by measuring a reflection of the light beam from the wafer.

7. The method of claim 5, wherein the surface reflectivity values are measured on surface dielectric layers of the plurality of sample wafers.

* * * * *